United States Patent [19]
Lee

[11] Patent Number: 5,935,875
[45] Date of Patent: Aug. 10, 1999

[54] DUAL INSULATING LAYER METHODS FOR FORMING INTEGRATED CIRCUIT GATES AND CONDUCTIVE CONTACTS

[75] Inventor: Joo-young Lee, Kyungki-do, Rep. of Korea

[73] Assignee: Samsung Electronics Co., Ltd., Rep. of Korea

[21] Appl. No.: 08/785,091

[22] Filed: Jan. 21, 1997

[30] Foreign Application Priority Data

Aug. 20, 1996 [KR] Rep. of Korea .................. 96-34509

[51] Int. Cl.[6] .................................................. H01L 21/302
[52] U.S. Cl. ........................ 438/737; 438/738; 438/740
[58] Field of Search .................................. 438/241, 258, 438/737, 738, 740

[56] References Cited

U.S. PATENT DOCUMENTS 4,484,978 11/1984 Keyser .
5,786,249 3/1996 Dennison .

*Primary Examiner*—Richard Booth
*Assistant Examiner*—Jonathan Hack
*Attorney, Agent, or Firm*—Myers Bigel Sibley & Sajovec

[57] ABSTRACT

A second insulating layer is used to mask a first insulating layer on a second gate electrode, during fabrication of a conductive contact adjacent a first gate electrode which is spaced apart from the second gate electrode. By using the second insulating layer as a sacrificial insulating layer during etching of the conductive contact, thinning of the first insulating layer on the second gate electrode may be prevented. In particular, first and second spaced apart gate electrodes are formed on an integrated circuit surface. The first and second spaced apart gate electrodes include first and second sidewalls, respectively. The first insulating layer and the second insulating layer are formed on the integrated circuit surface, including on the first and second gate electrodes. The second insulating layer is removed from the first gate. The first insulating layer is etched on the first gate to thereby form first spacers on the first sidewalls. A conductive contact is formed on the integrated circuit face, adjacent the first gate electrode and extending onto the first sidewall. The second insulating layer is removed from on the second gate and the first insulating layer is etched on the second gate, to thereby form second spacers on the second sidewalls.

14 Claims, 4 Drawing Sheets

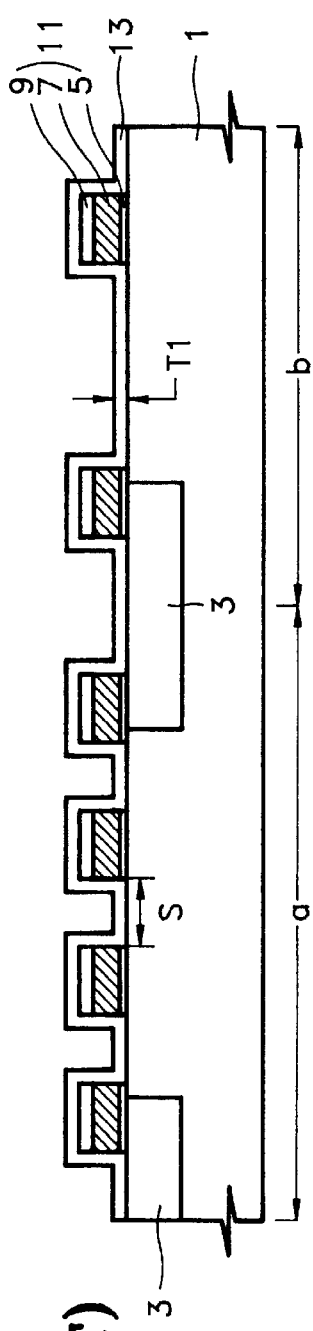
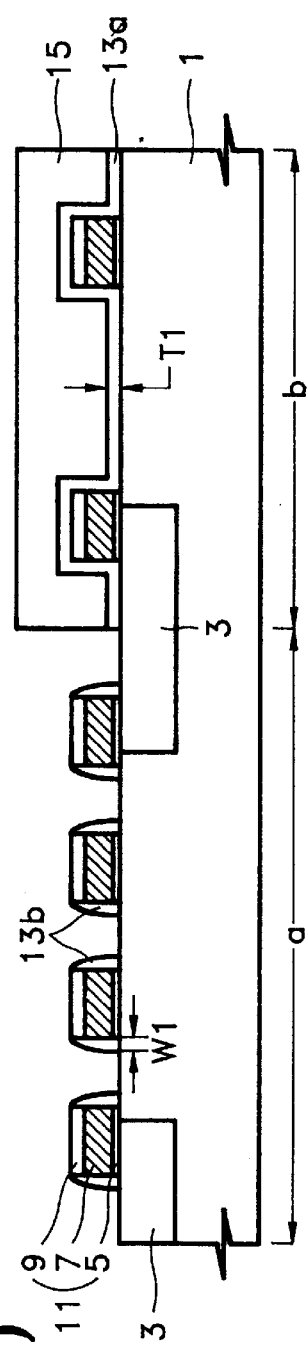
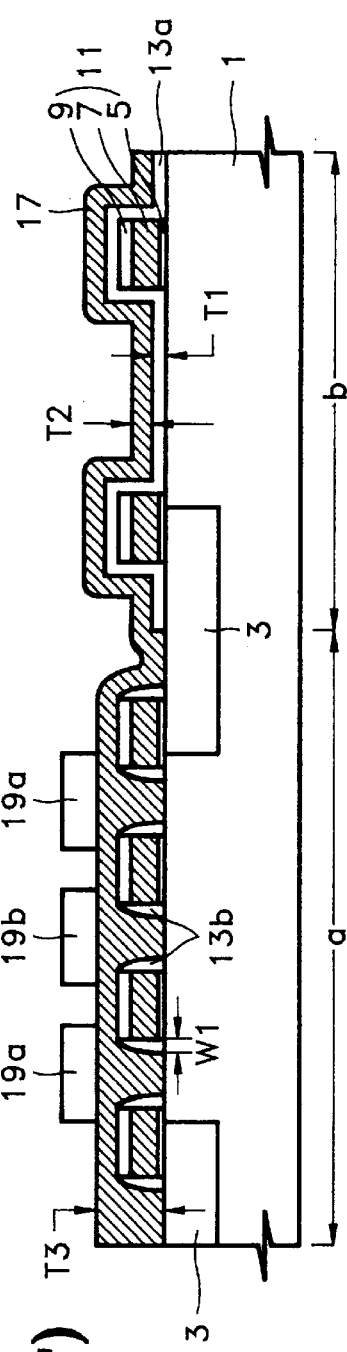
FIG. 1 (PRIOR ART)
FIG. 2 (PRIOR ART)
FIG. 3 (PRIOR ART)

DUAL INSULATING LAYER METHODS FOR FORMING INTEGRATED CIRCUIT GATES AND CONDUCTIVE CONTACTS

FIELD OF THE INVENTION

This invention relates to methods of fabricating integrated circuit devices such as integrated circuit memory devices, and more particularly to methods of fabricating gate electrodes and contacts for integrated circuit devices such as integrated circuit memory devices.

BACKGROUND OF THE INVENTION

As integrated circuit devices become more highly integrated, it may be increasingly difficult to form gate electrodes and conductive contacts for the devices. For example, as a semiconductor memory device becomes more highly integrated, the structure of a memory cell generally becomes more complicated. A memory cell of a highly integrated dynamic random access memory (DRAM) device generally comprises a pass transistor and a capacitor. A high performance capacitor is formed in a defined area in order to reduce the soft error rate (SER) and enhance the operational characteristics of the cell at low voltages. Thus, capacitor-over-bitline (COB) structures have been developed, where a capacitor is formed on a bitline in order to form the high performance capacitor.

In a memory cell of the COB structure, the bitline should be connected to a drain region (or a source region) of the pass transistor, and the storage electrode of the capacitor should be connected to a source region (or a drain region) of the pass transistor. In order to connect different conductive layers to each other, a bit line contact hole and a storage electrode contact hole should be formed on the drain region of the pass transistor and the source region thereof, respectively.

Unfortunately, as the DRAM device becomes more highly integrated, the bit line or the storage electrode contact hole may become narrower and deeper. Therefore, the contact resistance may increase. The process margin which prevents misalignment of the contact hole may also be reduced during the photolithography process for forming the contact hole, which can thereby degrade the reliability of the DRAM device.

A conventional method for forming a bit line buffer pad (conductive contact) in the bit line contact hole, and for forming a storage electrode buffer pad (conductive contact) in the storage electrode contact hole will now be described. FIGS. 1 through 5 are cross-sectional views for illustrating a method for forming buffer pads (conductive contacts) of a conventional DRAM device. Portions indicated by reference characters "a" and "b" represent a cell array region and a peripheral circuit region, respectively.

Referring to FIG. 1, a trench region is formed on a predetermined area of a semiconductor substrate 1 by a conventional method, and an isolation film 3 comprising an insulating film is formed in the trench region. A gate pattern 11 is then formed, by sequentially depositing and etching a gate oxide film 5, a gate electrode 7 and a capping insulating film 9. The gate electrode 7 is used as a wordline of the DRAM device. The spacing "s" between the gate patterns 11 formed on the cell array region "a" is generally narrower than the spacing between the gate patterns 11 formed on the peripheral circuit region "b".

Next, an insulating film 13 having a predetermined thickness T1, for example, a high temperature oxide (HTO) film, is formed on the entire surface of the resultant structure. The thickness T1 is determined so that the region between the gate patterns 11 formed in the cell array region "a" is not completely filled with the high temperature oxide film 13.

FIG. 2 is a cross-sectional view for illustrating the step of forming first spacers 13b on the sidewalls of the gate patterns 11 formed in a cell array region "a". In detail, a first photoresist pattern 15 is formed for covering a peripheral circuit region "b" of the resultant structure having the insulating film 13 formed therein. Then, the insulating film 13 exposed in the cell array region "a" is anisotropically etched using the first photoresist pattern 15 as a mask. The first spacer 13b is formed with a predetermined width W1 on the sidewall of the gate pattern 11 of the cell array region "a", and an insulating film pattern 13a is formed for covering only the peripheral circuit region "b".

FIG. 3 is a cross-sectional view for illustrating the step of forming a conductive film 17 and second photoresist patterns 19a and 19b for defining a buffer pad. In detail, the first photoresist pattern 15 is removed, and then a conductive film 17 having a thickness T2, for example a doped polysilicon film, is formed on the entire surface of the resultant structure. The conductive film 17 is formed thick enough to completely fill the region between the gate patterns 11 of the cell array region "a". The thickness T2 represents the thickness of the conductive film 17 formed on the area where the interval between the gate patterns is wide. Accordingly, the actual thickness T3 of the conductive film 17 filled in the gate pattern 11 of the cell array region "a" is thicker than the thickness T2. Then, second photoresist patterns 19a and 19b are formed by conventional photolithography, to cover the conductive film 17 filled in the gate patterns 11 of the cell array region "a". The conductive film 17 having the thickness T3 is exposed in the cell array region.

FIG. 4 is a cross-sectional view for illustrating the step of forming a storage electrode pad 17a and a bitline pad 17b as buffer pads. In detail, the conductive film 17 is dry-etched using the second photoresist patterns 19a and 19b as a mask, to thereby form a buffer pad (a storage electrode pad 17a and a bitline pad 17b) for covering the source and drain regions between the gate patterns 11 of the cell array region "a". An over-etching process is preferably performed in order to completely remove the conductive film 17 having thickness T3 from the cell array region "a".

Unfortunately, the exposed insulating film pattern 13a of the peripheral circuit region becomes thinner due to the over-etching process for forming the buffer pads 17a and 17b. The reason is that the insulating film pattern 13a is also slightly etched, while the conductive film 17 is etched. As a result, the insulating film pattern 13a under the conductive film 17 formed in the peripheral circuit region "b" is etched, to thereby form an insulating film pattern 13c having thickness T1' which is smaller than the initial thickness T1.

When the initial thickness T1 of the insulating film 13 is small, the semiconductor substrate 1, including the source and drain regions of a transistor between the gate patterns 11 of the peripheral circuit region "b", may be exposed, or the semiconductor substrate 1 may be damaged by over-etching. Still referring to FIG. 4, the second photoresist patterns 19a and 19b are removed, and then a third photoresist pattern 21 for covering the cell array region "a" is formed.

FIG. 5 is a cross-sectional view for illustrating the step of forming a second spacer 13d on the sidewall of the gate pattern 11 of a peripheral circuit region "b". In detail, the insulating film pattern 13c in the peripheral circuit region "b" is anisotropically etched using the third photoresist pattern 21 as a mask, to thereby form the second spacer 13d on the sidewall of the gate pattern 11 of the peripheral circuit region "b". The width W2 of the second spacer 13d is less than width W1 of the first spacer 13b.

A first inter-dielectric layer and a bitline are then formed on the resultant structure. Then a second inter-dielectric layer, a storage electrode, a dielectric film and a plate electrode are formed, to thereby complete a DRAM cell.

As described above, according to a method for forming a conventional buffer pad, the width of second spacers formed on the sidewalls of the gate patterns of the peripheral circuit region is affected by the over-etching during formation of the buffer pads. When the insulating film is thin to begin with, the source and drain regions of a transistor in the peripheral circuit region may be damaged by the etching. The etching damage may increase the leakage current of the transistor, which may increase the power consumption of a DRAM device. Further, since the width of the second spacers is less than that of the first spacers, the effective channel length of the transistor formed in the peripheral circuit region is generally reduced, which may lead to short channel effects.

SUMMARY OF THE INVENTION

It is therefore an object of the present invention to provide improved methods of fabricating gates and conductive contacts for integrated circuits.

It is another object of the present invention to provide improved methods of fabricating gate electrodes and buffer pads for integrated circuit memory devices.

These and other objects are provided, according to the present invention, by dual insulating layer methods which use a second insulating layer to mask a first insulating layer on a second gate electrode, during fabrication of a conductive contact adjacent a first gate electrode which is spaced apart from the second gate electrode. Thus, thinning of the first insulating layer on the second gate electrode is reduced and preferably eliminated, due to the presence of the sacrificial second insulating layer, notwithstanding that the conductive contact layer is overetched during formation of the conductive contact.

In particular, first and second spaced apart gate electrodes are formed on an integrated circuit surface. The first and second spaced apart gate electrodes include first and second sidewalls respectively. A first insulating layer and second insulating layer are formed on the integrated circuit surface, including on the first and second gate electrodes. The second insulating layer is removed from on the first gate. The first insulating layer on the first gate is etched to thereby form first spacers on the first sidewalls. A conductive contact is formed on the integrated circuit face, adjacent the first gate electrode, and extending onto the first sidewall. The second insulating layer is then removed from on the second gate. The first insulating layer is then etched on the second gate, to thereby form second spacers on the second sidewalls.

The second insulating layer protects the first insulating layer on the second gate during formation of the conductive contact. Preferably, the first insulating layer comprises silicon nitride and the second insulating layer comprises silicon dioxide. The conductive contact is preferably formed by forming a conductive layer on the integrated circuit surface including on the first gate and etching the conductive layer from a portion of the first gate to define the conductive contact.

Methods of forming buffer pads of a semiconductor memory device having a cell array region and a peripheral circuit region according to the invention include the following steps: A plurality of gate patterns are formed on the cell array region and on the peripheral circuit region of semiconductor substrate. A first insulating film and a second insulating film are sequentially formed on the surface of the semiconductor substrate, including on the gate patterns. The second insulating film is patterned to form a second insulating film pattern which exposes the first insulating film on the cell array region. The first insulating film on the cell array region is then anisotropically etched, to form first spacers on the sidewalls of the gate patterns on the cell array region.

A conductive film is formed on the surface of the semiconductor substrate including on the gate patterns. The conductive film is patterned to form buffer pads on the semiconductor substrate between the gate patterns of the cell array region. The second insulating film pattern is removed to expose the first insulating film pattern thereunder. The exposed first insulating film pattern is anisotropically etched to form second spacers on the sidewalls of the gate patterns on the peripheral circuit region.

The gate patterns are preferably formed by sequentially forming a gate insulating film, a conductive film and a capping insulating film on the surface of the semiconductor substrate and sequentially patterning the capping insulating film, the conductive film and the gate insulating film. Preferably, the capping insulating film comprises silicon oxide, the first insulating film comprises silicon nitride, the second insulating film comprises silicon oxide and the conductive film comprises doped polysilicon.

According to the present invention, over etching damage to the peripheral circuit region can be reduced or prevented, and the width of the second spacers can be the same as that of the first spacers. Accordingly, the leakage current of the semiconductor memory device can be reduced, and transistors having uniform characteristics can be fabricated in the peripheral circuit region.

BRIEF DESCRIPTION OF THE DRAWINGS

FIGS. 1 through 5 are cross-sectional views of a conventional method for forming buffer pads.

DETAILED DESCRIPTION OF PREFERRED EMBODIMENTS

Figure 4:
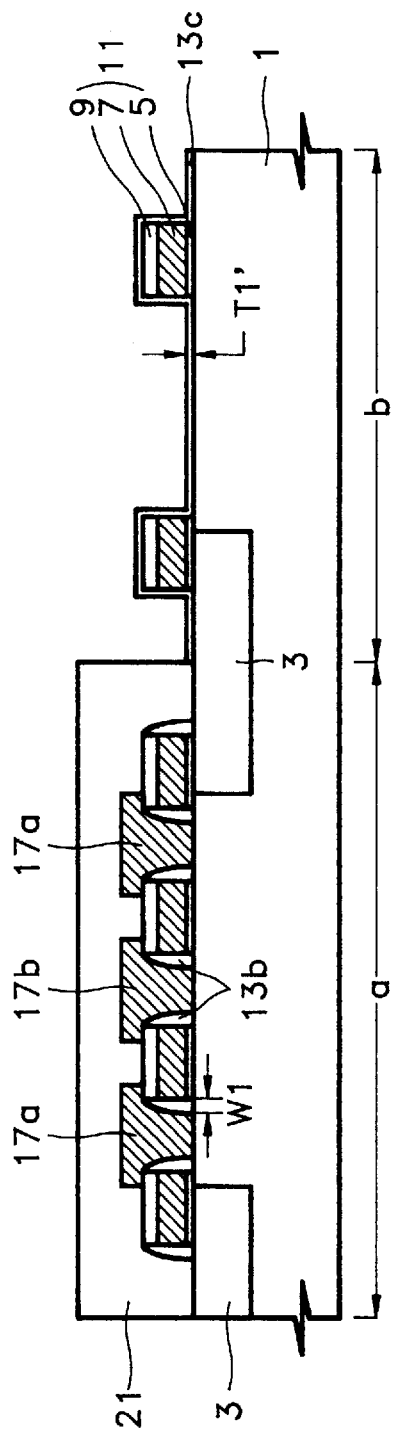
Figure 5:
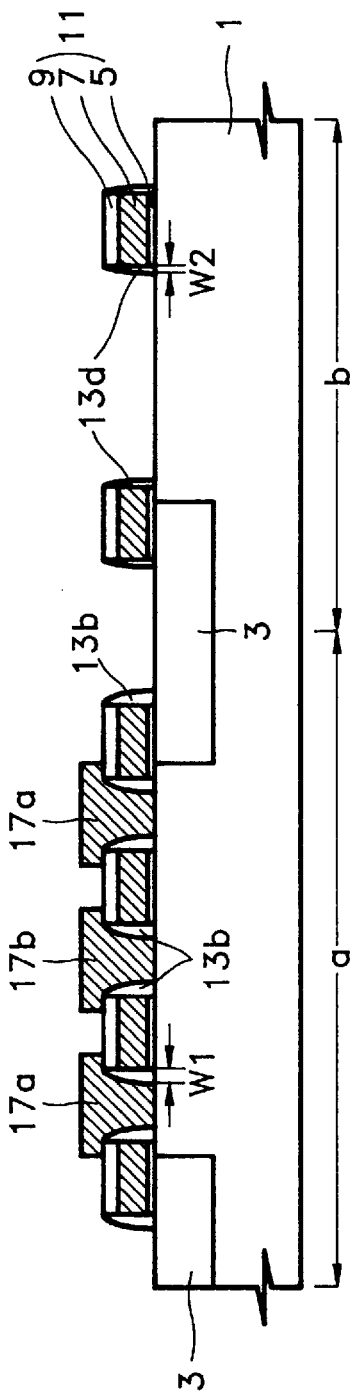

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will also be understood that when a layer is referred to as being "on" another layer or substrate, it can be directly on the other layer or substrate, or intervening layers may also be present.

In FIGS. 6 through 10, reference characters "a" and "b" represent a cell array region and a peripheral circuit region, respectively.

Figure 6:
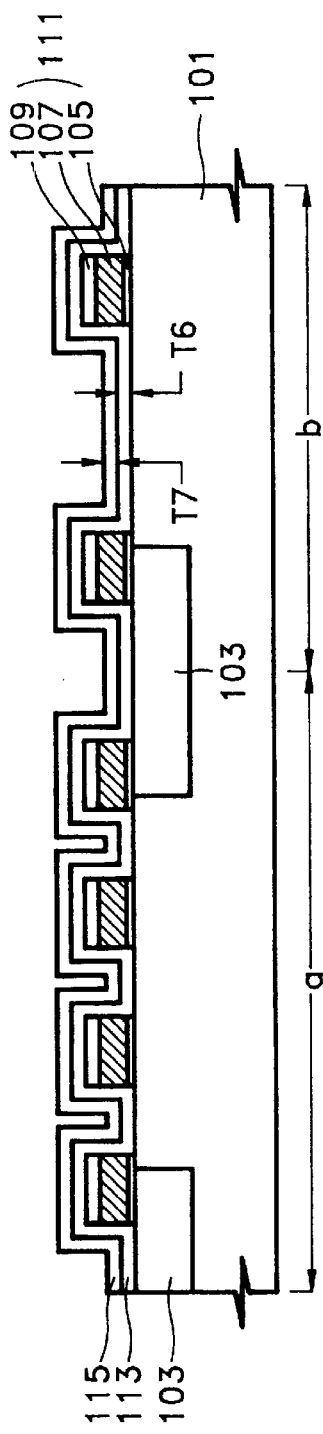
FIGS. 6 through 10 are cross-sectional views of methods for forming buffer pads according to the present invention.

FIG. 6 is a cross-sectional view for illustrating the step of forming gate patterns 111, a first insulating film 113 and a second insulating film 115. First, an isolation film 103 which defines an active region and an inactive region is formed on a predetermined area of a semiconductor substrate 101 using a conventional method. The isolation film 103 can be formed by a conventional isolation method such as a trench method or a LOCOS method. Next, a gate insulating film 105, a conductive film for a gate electrode 107 and a capping insulating film 109 are sequentially formed on the surface of the semiconductor substrate 101.

The gate insulating film is preferably formed of a thermal oxide film, and the capping insulating film is preferably formed of a silicon oxide film by a chemical vapor deposition (CVD) method. Also, the conductive film for a gate electrode is preferably formed of a doped polysilicon film or a polycide film formed by depositing a doped polysilicon film and a silicide film including a refractory metal.

The capping insulating film, the conductive film for a gate electrode and the gate insulating film are then sequentially patterned, to thereby form a gate pattern 111 including a gate insulating film 105, a gate electrode 107 and a capping insulating film 109, on the cell array region "a" and on the peripheral circuit region "b". The gate electrode 107 formed on the cell array region "a" is used as a wordline for selecting a desired cell. The spacing between the gate patterns 111 of the cell array region "a" is generally smaller than that of the gate patterns 111 of the peripheral circuit region "b" as shown in FIG. 6.

Still referring to FIG. 6, the first insulating film 113 having a predetermined thickness T6 and the second insulating film 115 having a first thickness T7 are sequentially formed on the resultant structure where the gate patterns 111 are formed. The first insulating film 113 is preferably formed of a material having high dry etch selectivity relative to the capping insulating film 109. For example, a silicon nitride first insulating film 113 may be used. The second insulating film 115 is preferably formed of a material having high wet etch selectivity relative to the first insulating film 113. For example, a silicon oxide second insulating film 115 may be used.

In other words, the amount of the capping insulating film 109 which is etched when dry etching the first insulating film 113 should be small, and the amount of the first insulating film 113 which is etched when wet etching the second insulating film 115, for example using hydrofluoric(HF) acid solution or buffered oxide etchant (BOE), should be small. The thickness T6 of the first insulating film 113 is preferably about or less than 1000 Å in order to obtain reduced electrical contact resistance between the source and drain of the active region and the buffer pads in the cell array region. The second insulating film 115 is preferably at least 500 Å in thickness to prevent the over etching of the first insulating film 113.

Figure 7:
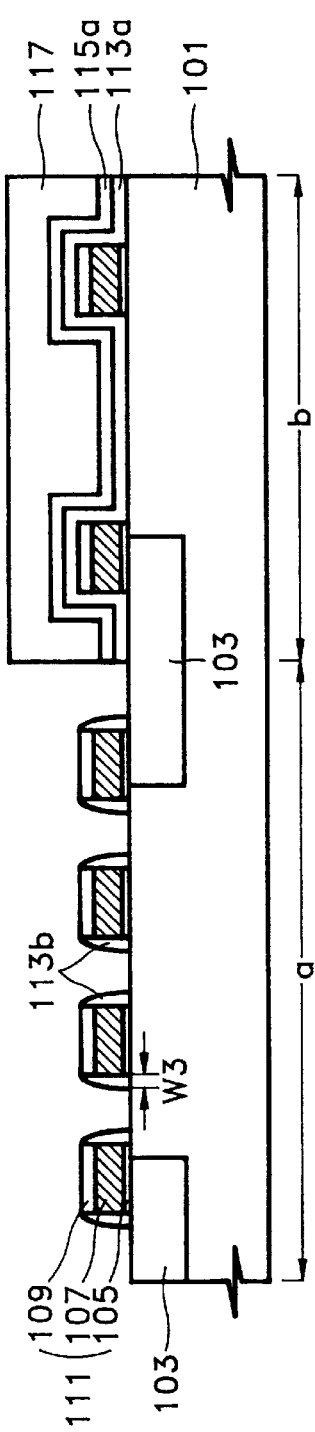

FIG. 7 is a cross-sectional view for illustrating the step of forming first spacers 113b on the sidewall of the gate patterns 111 of the cell array region "a". In detail, a first photoresist pattern 117 is formed for covering the peripheral circuit region "b" of the resultant structure where the second insulating film 115 is formed, to thereby expose the second insulating film 115 of the cell array region "a". Next, the second insulating film 115 of the cell array region "a" is isotropically etched, for example a wet strip by BOE, to thereby expose the first insulating film 113 thereunder. At the same time, a second insulating film pattern 115a for covering the peripheral circuit region "b" is formed. After baking the first photoresist pattern 117, the exposed first insulating film 113 is anisotropically etched using the first photoresist pattern 117 as a mask, to thereby form the first spacers 113b having a predetermined width W3 on the sidewall of the gate pattern 111 of the cell array region "a", and a first insulating film pattern 113a under the second insulating film pattern 115a of the peripheral circuit region.

Figure 8:
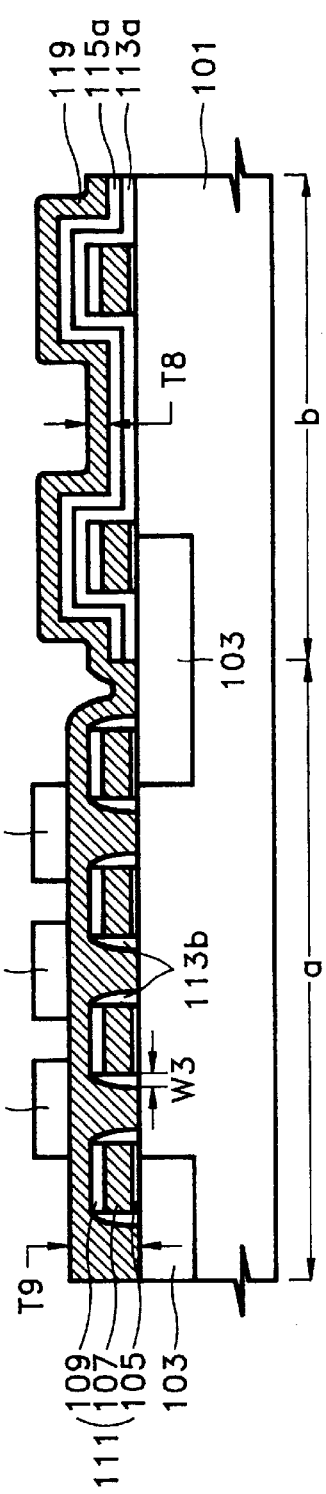

FIG. 8 is a cross-sectional view for illustrating the step of forming a conductive film 119. In detail, the first photoresist pattern 117 is removed, and then a conductive film having a thickness T8, for example, a doped polysilicon film, is formed on the entire surface of the resultant structure. The conductive film 119 is formed thick enough to completely fill the region between the gate patterns 111 of the cell array region "a". Accordingly, the actual thickness T9 of the conductive film 119 formed between the gate patterns 111 of the cell array region "a" is greater than the thickness T8 of the conductive film 119 formed on the peripheral circuit region "b". Next, second photoresist patterns 121a and 121b for forming buffer pads, are formed over the active region between the gate patterns 111 of the cell array region "a".

Figure 9:
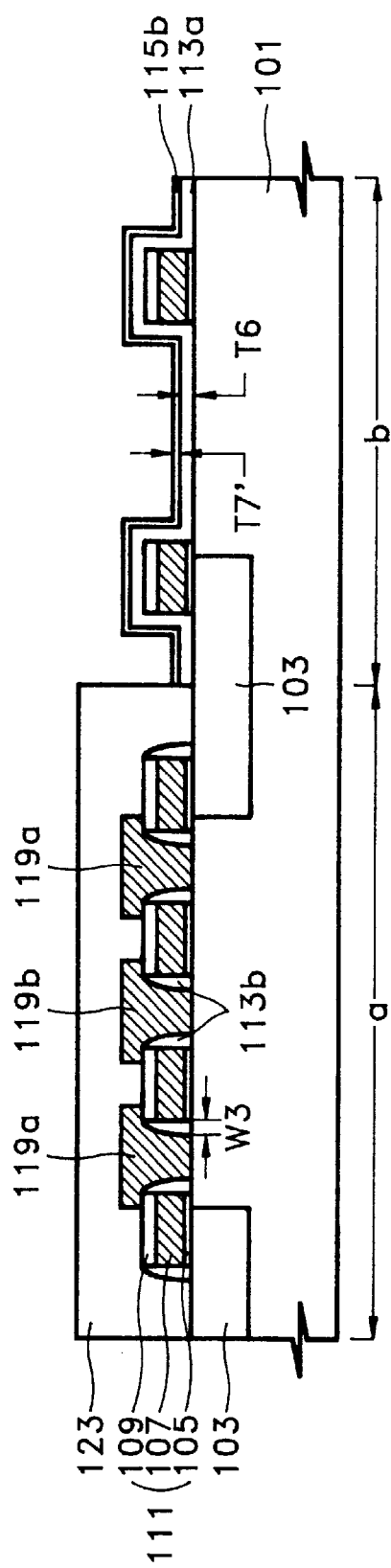

FIG. 9 is a cross-sectional view for illustrating the step of forming buffer pads, i.e., a bitline pad 119b and a storage electrode pad 119a. In detail, the conductive film 119 is etched, using the second photoresist patterns 121a and 121b as a mask, to thereby form the storage electrode pad 119a and the bitline pad 119b for covering the active region between the gate patterns 111 of the cell array region "a". An over-etching process is preferably performed in order to completely etch the conductive film 119 formed on the isolation film 103 of the cell array region "a". However, since the second insulating film pattern 115a is exposed after the conductive film 119 of the peripheral circuit region "b" is etched, the second insulating film pattern 115a is over-etched, to thereby form a second insulating film pattern 115b having a second thickness T7' smaller than that of the first thickness T7.

Thus, even if the initial thickness T7 of the second insulating film pattern 115a is small enough to completely be removed during the over-etching for forming the buffer pads 119a and 119b, etching of the first insulating film pattern 113a can be greatly reduced or prevented. The second insulating film pattern 115a acts as a sacrificial insulating film. Therefore, a sufficient etch margin for forming the conductive film can be achieved when forming the buffer pads. Still referring to FIG. 9, the second photoresist patterns 121a and 121b are removed, and then a third photoresist pattern 123 for covering the cell array region "a" is formed by a conventional photolithography process.

Figure 10:
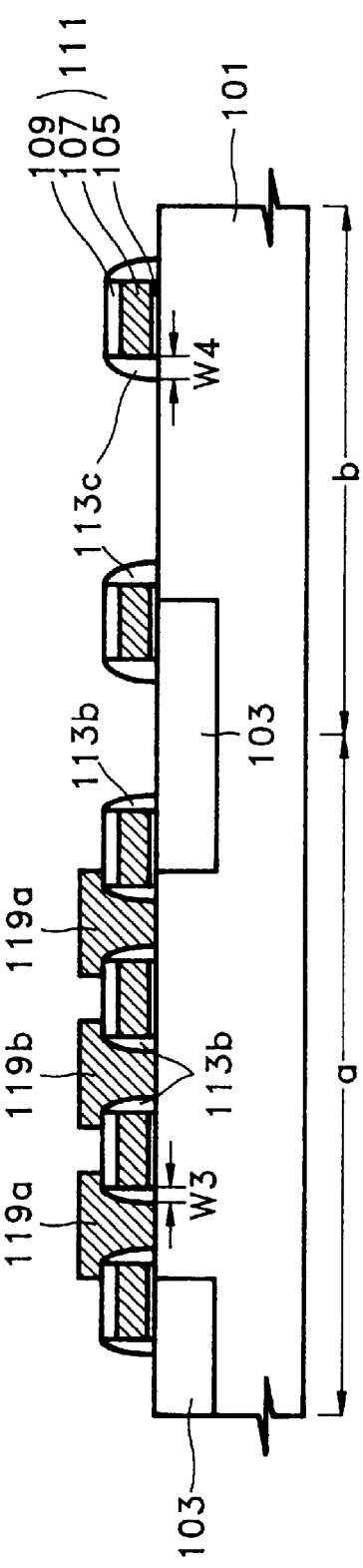

FIG. 10 is a cross-sectional view for illustrating the step of forming second spacers 113c. In detail, the second insulating film pattern 115b having the second thickness T7' is removed using a chemical solution, for example an HF solution or an HF buffered oxide etchant (BOE), using the third photoresist pattern 123 as a mask, to thereby expose the first insulating film pattern 113a under the second insulating film pattern 115b. After baking the third photoresist pattern 123, the exposed first insulating film pattern 113a is anisotropically etched, to thereby form the second spacers 113c on the sidewalls of the gate patterns 111 of the peripheral circuit region "b".

The width W4 of the second spacers 113c is preferably the same as the width W3 of the first spacers 113b. The same width can be produced because the predetermined thickness T6 of the first insulating film pattern 113a is maintained immediately before the anisotropic etching process for forming the second spacers 113c. In order for the width W4 of the second spacers 113c to be larger than the width W3 of the first spacers 113b, the second insulating film pattern 115b and the first insulating film pattern 113a may be anisotropically etched in sequence, while omitting the step of removing the second insulating film pattern 115b, to thereby form the second spacers 113c. Still referring to FIG. 10, the third photoresist pattern 123 is removed.

Subsequently, although not shown, a first inter-dielectric layer and a bitline connected to the bitline pad 119b are formed on the entire surface of the resultant structure in a conventional manner. Then, the second inter-dielectric layer is formed. A storage electrode connected to the storage electrode pad 119a, a dielectric film and a plate electrode are then sequentially formed, to thereby complete a cell and a transistor of the peripheral circuit of a highly integrated DRAM device.

Accordingly, a second insulating film, which acts as a sacrificial insulating film, is formed on a first insulating film for forming first and second spacers, to thereby prevent a first insulating film pattern on the peripheral circuit region from being exposed during an etching process for forming buffer pads on the cell array region. Therefore, the spacer width of cell array and peripheral circuit region can be controlled uniformly. Accordingly, the second spacers having a width equal to or greater than that of the first spacers, which are formed on the sidewalls of the gate patterns of the cell array region, can be formed on the sidewalls of the gate pattern of the peripheral circuit region.

As a result, damage to active regions of the peripheral circuit region can be reduced or prevented during the etching process. Also, over-etching of the conductive film for forming the buffer pads can be used to prevent etch residue from remaining. Thus, a stable transistor with reduced short channel effects can be fabricated on the peripheral circuit region. The reliability of a semiconductor memory device may thus be improved, and the power consumption may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method for forming buffer pads of a semiconductor memory device on a semiconductor substrate including a cell array region and a peripheral circuit region, comprising the steps of:
    forming a plurality of gate patterns on said cell array region and on said peripheral circuit region of said semiconductor substrate;
    sequentially forming a first insulating film and a second insulating film on the surface of said semiconductor substrate including on said gate patterns;
    patterning said second insulating film to form a second insulating film pattern which exposes said first insulating film on said cell array region including on the sidewalls of said gate patterns on said cell array region;
    anisotropically etching said exposed first insulating film on said cell array region, to form first spacers on the sidewalls of said gate patterns on said cell array region;
    forming a conductive film on the surface of the semiconductor substrate, including on said gate patterns;
    patterning said conductive film to form buffer pads on said semiconductor substrate, between said gate patterns of said cell array region,
    removing said second insulating film pattern to expose said first insulating film pattern thereunder on said peripheral circuit region including on the sidewalls of said gate patterns on said peripheral circuit region; and
    anisotropically etching said exposed first insulating film pattern on said peripheral circuit region, to form second spacers on the sidewalls of said gate patterns on said peripheral circuit region.

2. A method for forming buffer pads of a semiconductor memory device according to claim 1, wherein the step of forming a plurality of gate patterns comprises steps of:
    sequentially forming a gate insulating film, a conductive film and a capping insulating film on the surface of said semiconductor substrate; and
    sequentially patterning said capping insulating film, said conductive film and said gate insulating film.

3. A method for forming buffer pads of a semiconductor memory device according to claim 2, wherein said capping insulating film comprises a silicon oxide film.

4. A method for forming buffer pads of a semiconductor memory device according to claim 1, wherein said first insulating film comprises a silicon nitride film.

5. A method for forming buffer pads of a semiconductor memory device according to claim 1, wherein said second insulating film comprises a silicon oxide film.

6. A method for forming buffer pads of a semiconductor memory device according to claim 1, wherein said conductive film comprises a doped polysilicon film.

7. A gate electrode fabricating method for an integrated circuit comprising the steps of:
    forming first and second spaced apart gate electrodes on an integrated circuit surface, the first and second spaced apart gate electrodes including first and second sidewalls, respectively;
    forming a first insulating layer and a second insulating layer on the integrated circuit surface, including on the first and second gate electrodes;
    removing the second insulating layer from on the first insulating layer on the first gate to expose the first insulating layer on the first gate including on the first gate sidewalls;
    etching the exposed first insulating layer on the first gate, to thereby form first spacers on the first sidewalls;
    forming a conductive contact on the integrated circuit face, adjacent the first gate electrode, and extending onto the first sidewall;
    removing the second insulating layer from on the first insulating layer on the second gate to expose the first insulating layer on the second gate including on the second sidewalls; and
    etching the exposed first insulating layer on the second gate, to thereby form second spacers on the second sidewalls.

8. A method according to claim 7 wherein the step of forming a first insulating layer and a second insulating layer on the integrated circuit surface, including on the first and second gate electrodes, comprises the steps of:
    forming a first insulating layer on the integrated circuit surface, including on the first and second gate electrodes; and
    forming a second insulating layer on the first insulating layer.

9. A method according to claim 7 wherein the first insulating layer comprises silicon nitride and wherein the second insulating layer comprises silicon oxide.

10. A method according to claim 7 wherein the step of etching the first insulating layer on the first gate comprises the step of:

anisotropically etching the first insulating layer on the first gate.

11. A method according to claim 7 wherein the step of etching the first insulating layer on the second gate comprises the step of:

anisotropically etching the first insulating layer on the second gate.

12. A method according to claim 7 wherein the step of forming a conductive contact on the integrated circuit face, adjacent the first gate electrode, and extending onto the first sidewall comprises the steps of:

forming a conductive layer on the integrated circuit surface including on the first gate; and etching the conductive layer from a portion of the first gate to define the conductive contact.

13. A method according to claim 7 wherein the conductive contact comprises a doped polysilicon conductive contact.

14. A method according to claim 7:

wherein the integrated circuit is an integrated circuit memory device, including a cell array region and a peripheral circuit region;

wherein the first gate electrode is on the cell array region; and wherein the second gate electrode is on the peripheral circuit region.

* * * * *